United States Patent [19]

Finley et al.

[11] Patent Number: 5,450,082
[45] Date of Patent: Sep. 12, 1995

[54] SINGLE MULTI-PURPOSE INPUT FOR DIFFERENT TYPES OF SENSORS WITH DATA EDGE CONDITIONING CIRCUIT OR ADC TO PROVIDE DIGITAL OUTPUT

[75] Inventors: Jeffrey L. Finley, Metamora; Mark R. Hawkins; Gregory L. Williamson, both of Chillicothe, all of Ill.

[73] Assignee: Caterpillar Inc., Peoria, Ill.

[21] Appl. No.: 158,348

[22] Filed: Nov. 29, 1993

[51] Int. Cl.6 .......................... H03M 1/12; H03M 1/60
[52] U.S. Cl. .................................... 341/141; 341/155; 341/157
[58] Field of Search ............... 341/141, 157, 158, 155, 341/118

[56] References Cited

U.S. PATENT DOCUMENTS

| | | | |
|---|---|---|---|
| 4,190,823 | 2/1980 | Leichle | 341/157 X |
| 4,264,898 | 4/1981 | Barman et al. | 341/141 |
| 4,417,234 | 11/1983 | McKenna | 341/141 |
| 4,429,564 | 2/1984 | Ikeda et al. | 73/32 A |
| 4,812,848 | 3/1989 | Fry | 341/157 |
| 4,929,890 | 5/1990 | Bell et al. | 324/76.62 |
| 5,291,197 | 3/1994 | Abe | 341/141 |
| 5,298,902 | 3/1994 | Kogan | 341/141 X |

*Primary Examiner*—Sharon D. Logan
*Attorney, Agent, or Firm*—Steven R. Janda

[57] ABSTRACT

An appparatus for receiving signals from any of a plurality of sensor types is provided and includes pull-up circuitry connected to a circuit input; data edge conditioning circuitry having a digital output and an input connected to said circuit input; and an analog output connected to said circuit input and said pull-up circuitry.

5 Claims, 1 Drawing Sheet

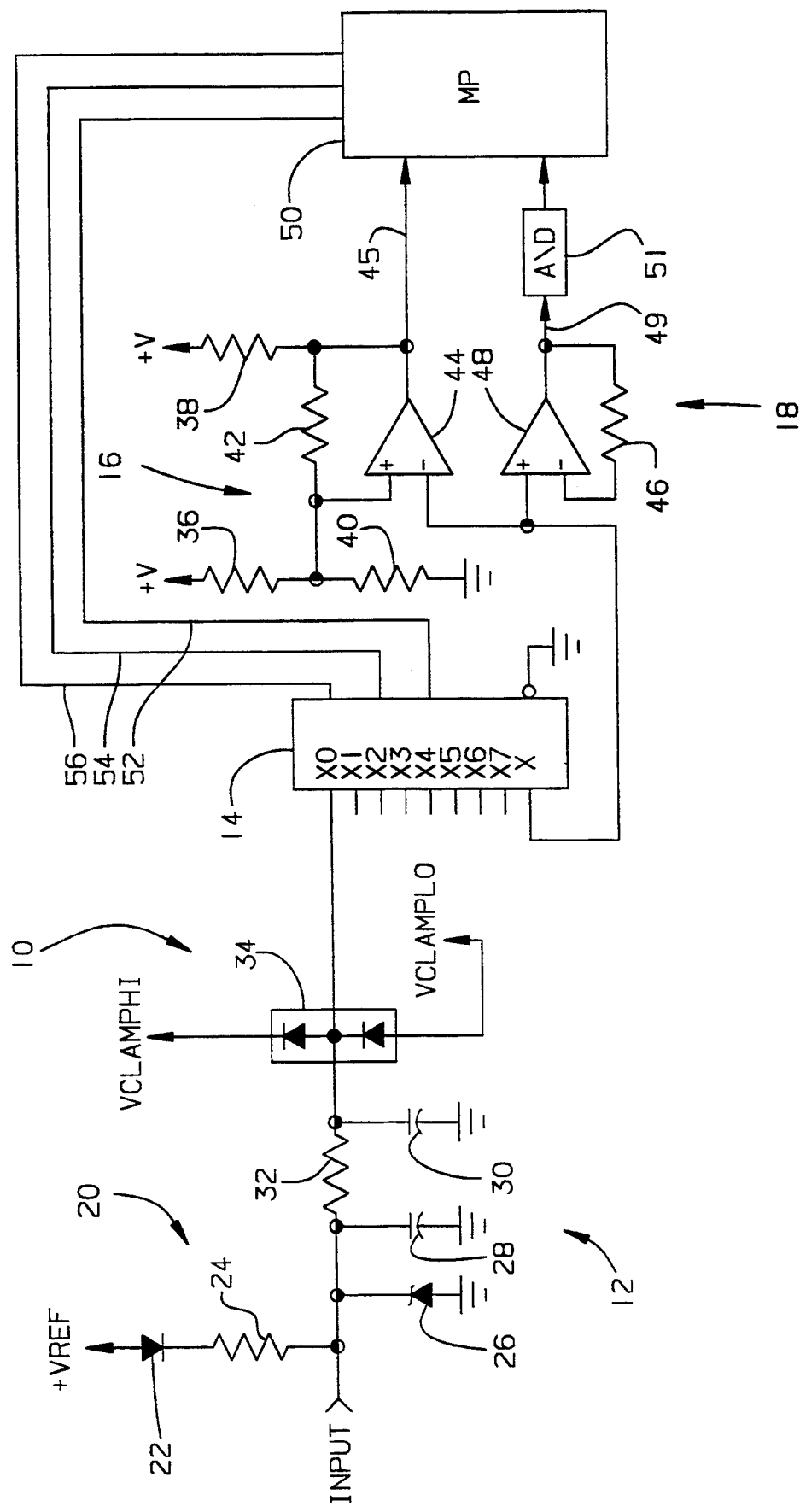

SINGLE MULTI-PURPOSE INPUT FOR DIFFERENT TYPES OF SENSORS WITH DATA EDGE CONDITIONING CIRCUIT OR ADC TO PROVIDE DIGITAL OUTPUT

TECHNICAL FIELD

This invention relates generally to a circuit for receiving signals in a control or monitoring system and more particularly to a circuit capable of receiving any of a plurality of different signal types.

BACKGROUND ART

Electronic controls and monitoring systems are advantageously included with work machines and complex tools. Such systems typically include input circuitry for conditioning signals received from sensors located about the machine. The sensors advantageously provide signals indicative of the level of sensed parameters and which are important to the operation of the electronic control or monitoring system. Similarly the input circuitry cooperates with the sensors in providing signals indicative of the sensed parameter value.

Each sensor type requires different circuitry, for example, resistive type sensors require a pull-up resistor to produce the signal indicating the level of the sensed parameter; whereas, frequency type or pulse width modulated sensors may be delivered directly to edge capturing hardware. Since each sensor type or family of sensors requires a different type of input circuitry, dedicated inputs were required for each type of sensor to be used in connection with the particular control or monitoring system. With there being a predefined subset of inputs associated with each sensor type or family of types, flexibility is necessarily limited. This lack of flexibility in prior art systems led to the use of separate controls for each application or the inefficient use of inputs. To reduce manufacturing costs, warehousing space, and the like, it is advantageous to be able to use a single design in connection with a number of different machine types or versions.

The present invention is directed to overcoming one or more of the problems set forth above.

DISCLOSURE OF THE INVENTION

The invention avoids the disadvantages of known input circuits and provides the ability to interface with many different types of sensors. This input flexibility allows broader control usage and reduces the need for control diversity.

In one aspect of the present invention, an appparatus for receiving signals from any of a plurality of sensor types is provided and includes pull-up circuitry connected to a circuit input; data edge conditioning circuitry having a digital output and an input connected to said circuit input; and an analog output connected to said circuit input and said pull-up circuitry.

The invention also includes other features and advantages that will become apparent from a more detailed study of the drawings and specification.

BRIEF DESCRIPTION OF THE DRAWING

For a better understanding of the present invention, reference may be made to the accompanying drawing illustrating a schematic diagram of one embodiment of the invention.

BEST MODE FOR CARRYING OUT THE INVENTION

Referring to FIG. 1, a schematic diagram of one embodiment of a multi-purpose input 10 is shown. The topology of the multi-purpose input 10 includes input protection 12, a multiplexer 14, a Schmitt trigger 16, and analog buffer hardware 18. Pull-up circuitry 20 is provided and includes a diode 22 and a resistor 24 which source current into the sensing device at the input. The input protection 12 includes a diode 26, a pair of capacitors 28,30, a resistor 32, and a diode pair 34 to set the voltage rails for digital inputs. The input protection 12 protects the internal hardware from external abuse. The multiplexer 14 allows the connection of many pull-up and protection networks 12,20 allowing input from many sensing devices. The Schmitt trigger 16 preferably includes four resistors 36,38,40,42 and an operational amplifier 44. The Schmitt trigger 16 provides distinct data edges for measurement by edge capturing hardware. The output 45 of the Schmitt trigger 16 provides a digital signal that is advantageously read by hardware capable of capturing or recording when the input changes state (logic 1 or 0). The analog buffer hardware 18 includes a resistor 46 and an operational amplifier 48. The analog buffer 18 serves to isolate the input hardware from any analog measuring hardware, such as an A/D converter (not shown).

The simplest embodiment includes the pull-up 20 and Schmitt trigger 16 with the analog output 49 connected directly to the input. The pull-up 20 in it's simplest form does not require the diode 22, but the diode protects the resistor from certain types of electrical abuse. The Schmitt trigger implementation may take many forms not necessarily the one shown herein. The other functional areas (input protection 12, multiplexer 14, and analog buffer 18) make the concept usable and more flexible in a real world environment. For example, the multiplexer 14 allows any of a plurality of signals from one of the multi-purpose inputs to be selected by a microprocessor as it executes its control or diagnostic routines.

In the preferred embodiment, a microprocessor 50 of a type well-known in the art receives and processes the data from the analog and digital outputs 49,45. It should be appreciated by those skilled in the art that other circuitry may be desirable between the analog output 49 and the microprocessor 50, such as an analog-to-digital converter 51. In the preferred embodiment signals are provided from the microprocessor 50 to the select inputs 52,54,56 of the multiplexer 14 to determine which of the plurality of inputs is to be delivered to the outputs. The signals delivered to the multiplexer 14 are determined in response to parameters required by the control or diagnostic algorithms being run by the microprocessor 50. The type of sensor associated with each of the inputs is machine and version dependent and the microprocessor 50 is programmed with parameter and input definitions that establish which type of sensor is associated with each input so the microprocessor 50 can properly interpret the received signal.

Industrial Applicability

The present invention is particularly useful in connection with work machines and vehicles having a plurality of different models and versions, each requiring a different set of parameters to be delivered to the control or diagnostic system. The present invention provides circuitry capable of delivering signals to a control or diagnostic system from any of a plurality of different sensor types thus allowing for design flexibility and commonality of parts.

Measurement of a resistive type sender is accomplished by measuring the input voltage to ground. The sensor resistance is a direct function of the sensed variable value. Since the resistor in the pull-up circuitry is a known value and Vref is known and compensated to null out the forward voltage drop of the diode it is possible to determine the resistance of the sensing device.

Similarly measurement of a buffered analog type sensor is accomplished by measuring the input voltage to ground. The sensor output voltage is a direct function of the sensed variable value.

Pulse width modulated data is measured by capturing the rising and falling edge times of the data stream. From the rising and falling edge times, the duty cycle may be determined. Pulse width modulated sensors have an output duty cycle which is a direct function of the sensed variable value.

Similarly measurement of a frequency type sensor is accomplished by capturing input edge times. From the input edge times the input frequency may be determined. Frequency type sensors have an output frequency which is a direct function of the sensed variable.

As with pulse width modulated and frequency data it is also possible to read serial data. Serial data is read by capturing the rising and falling edge times of the input data stream. From the rising and falling edge times of the serial data it is possible to reconstruct the serial data. Serial data type sensor output data is a direct funciton of the sensed variable.

Switch type sensors are read by sensing the logic state of the input.

Other aspects, objects, advantages and uses of this invention can be obtained from a study of the drawings, disclosure, and appended claims.

We claim:

1. An apparatus for receiving signals from any of a plurality of sensor types, comprising:
   pull-up circuitry connected to and between a circuit input and a reference voltage;
   data edge conditioning circuitry having a digital output and an input connected to said circuit input and said pull-up circuitry, said digital output being connected to a microprocessor; and
   an analog output connected to said circuit input and said pull-up circuitry, said analog output being connected to said microprocessor via an analog-to-digital converter.

2. An apparatus, as set forth in claim 1, wherein said data edge conditioning circuitry includes a Schmitt trigger.

3. An apparatus for receiving signals from any of a plurality of sensor types, comprising:
   a plurality of circuit inputs;
   a plurality of pull-up circuits each being connected to and between one of said circuit inputs and a reference voltage;
   a multiplexer having a plurality of multiplexer inputs and a multiplexer output, each of said plurality of pull-up circuits being connected to one of said multiplexer inputs;
   data edge conditioning circuitry having digital output and an input connected to said multiplexer output; and
   an analog output connected to said multiplexer output.

4. An apparatus, as set forth in claim 3, including a plurality of sensor signals each being delivered to one of said plurality of input circuits and wherein said multiplexer includes selection circuitry for determining which of said plurality of sensor signals is to be delivered to said analog and digital outputs.

5. An apparatus, as set forth in claim 3, wherein said data edge conditioning circuitry includes a Schmitt trigger.

* * * * *